United States Patent [19]

Schmalzl et al.

[11] Patent Number: 4,997,240

[45] Date of Patent: Mar. 5, 1991

[54] MODULAR HOUSING SYSTEM FOR ELECTRONIC EQUIPMENT

[75] Inventors: Dieter Schmalzl, Augsburg; Houchang Bavar, Munich; August Scherer, Dinkelscherben, all of Fed. Rep. of Germany

[73] Assignee: Siemens Aktiengesellschaft, Berlin and Munich, Fed. Rep. of Germany

[21] Appl. No.: 461,322

[22] Filed: Jan. 5, 1990

[30] Foreign Application Priority Data

Mar. 28, 1989 [DE] Fed. Rep. of Germany ....... 3910056

[51] Int. Cl.5 .............................................. A47B 47/00
[52] U.S. Cl. .................. 312/265.4; 312/265.2
[58] Field of Search ............... 312/257.1, 265.1, 265.2, 312/265.3, 265.4

[56] References Cited

U.S. PATENT DOCUMENTS

| 3,563,627 | 2/1971 | Whipps | 312/265.2 |
| 4,045,104 | 8/1977 | Peterson | 312/265.4 |
| 4,768,845 | 9/1958 | Yeh | 312/257.1 |

FOREIGN PATENT DOCUMENTS

| 1146623 | 6/1990 | Canada | 312/265.4 |

*Primary Examiner*—Joseph Falk

*Attorney, Agent, or Firm*—Hill, Van Santen, Steadman & Simpson

[57] ABSTRACT

Modular housing system for electronic equipment. A modular housing system for electronic equipment, particularly in the field of data technology, has capping pieces of extruded sections provided with guide grooves in a longitudinal direction that are modularly joined with corner nodes and connector elements adaptable for the respective utilization. Particularly in the field of data technology, it is necessary to be able to undertake a structuring of electronic equipment that is fast, variable and simple to construct. The modular housing system has grooves with a keyhole-shaped cross section and proceed along the edges of the respective lateral surfaces of the capping pieces on verges thereof and/or parallel thereto. Bores are provided in the end faces of the capping pieces and the edges or verges at which no guide grooves proceed and a further bore is provided in the center of the cross section of the end face of the capping pieces. The capping pieces are connectable via corner nodes and the corner nodes are provided with two pegs residing diagonally opposite one another on each of three sides allocated to different coordinate planes. The pegs engage the end-face bores or channels of the capping pieces. A first bore having a small diameter is countersunk in the side of the corner node and is provided between the two pegs. A large bore is provided in the opposite surface without pegs.

23 Claims, 4 Drawing Sheets

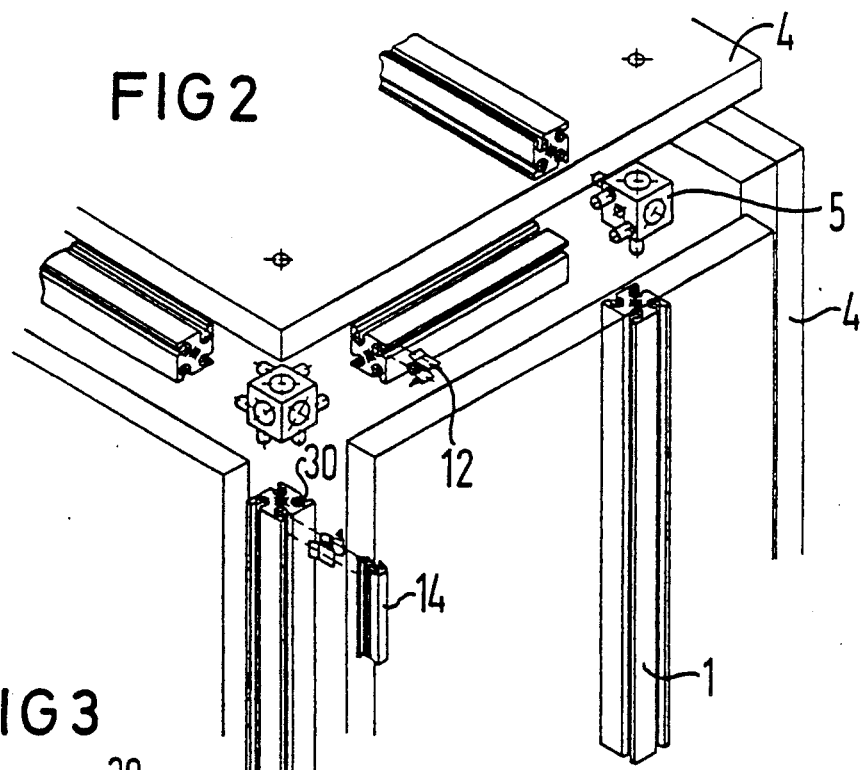
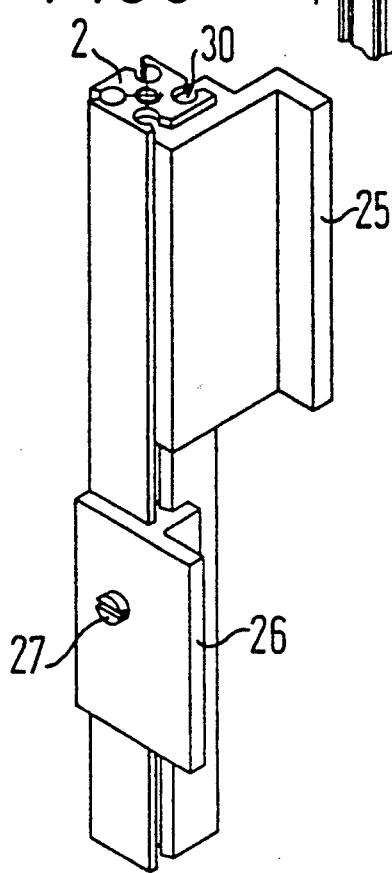
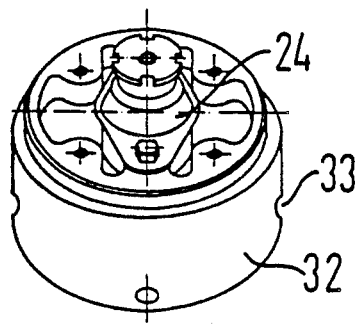
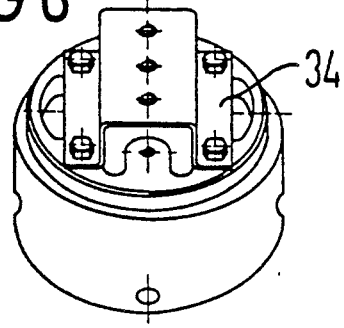

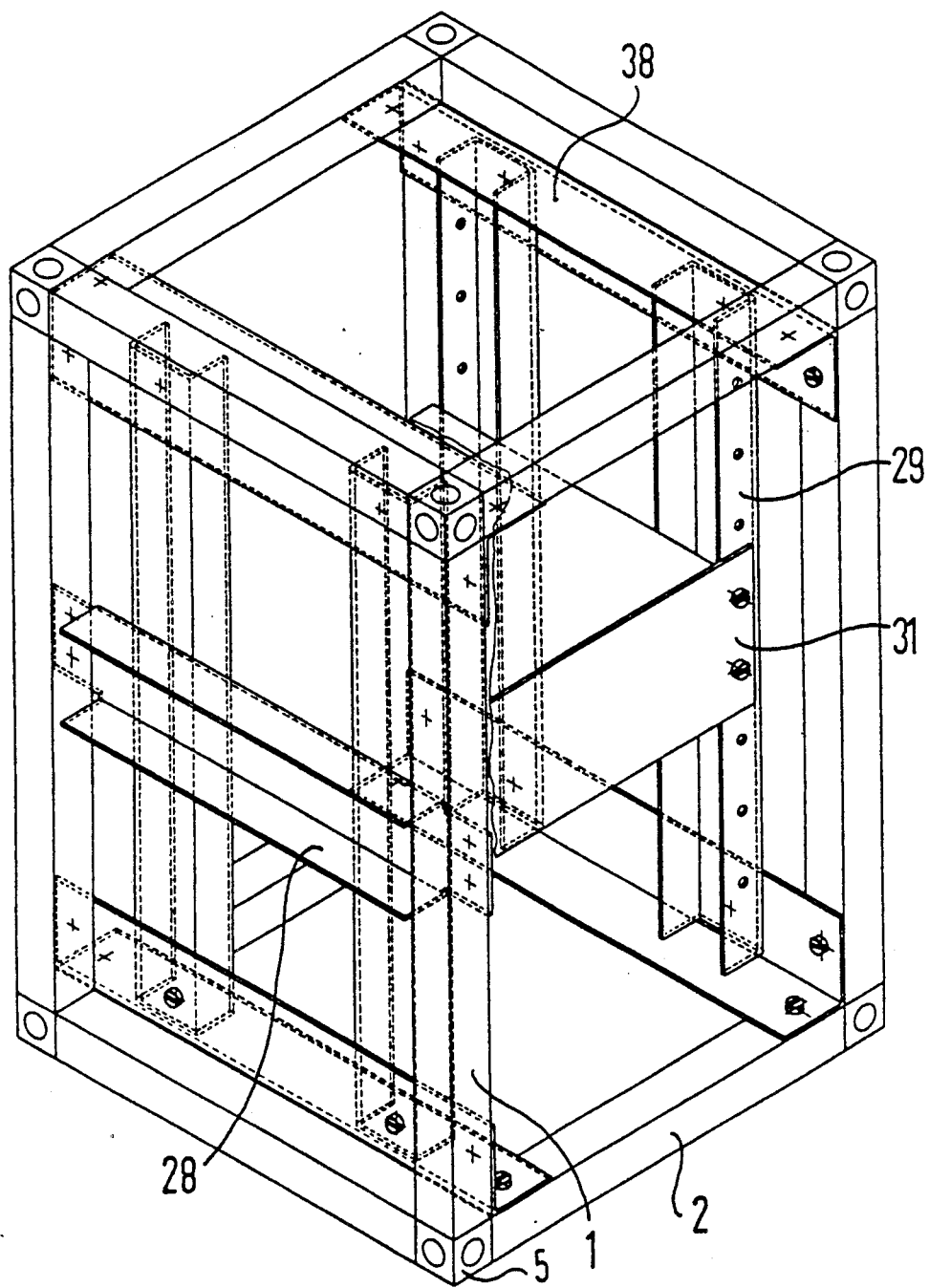

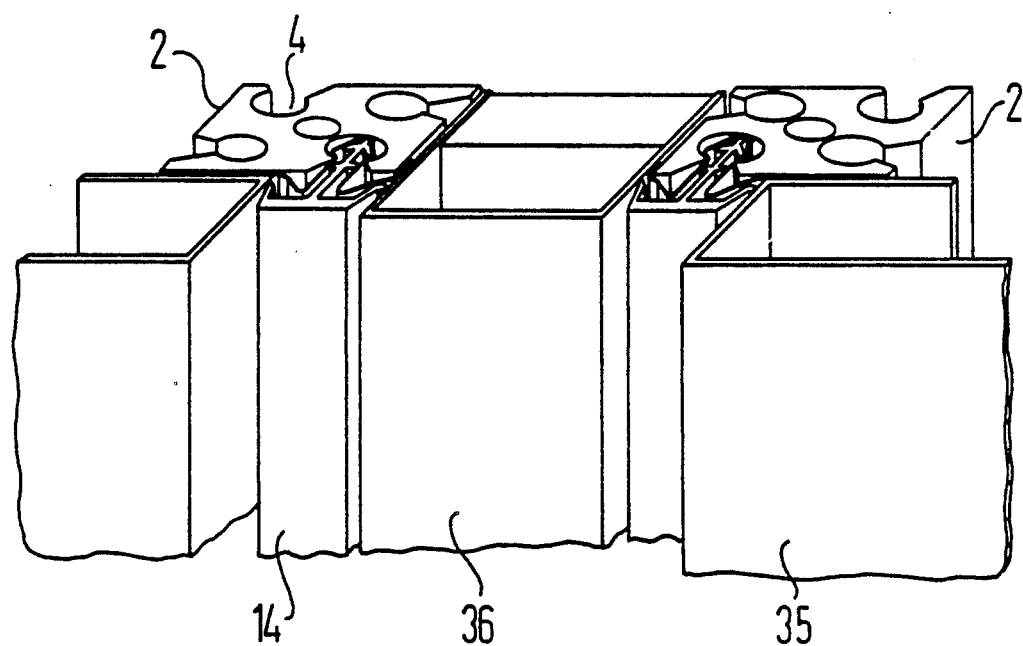

MODULAR HOUSING SYSTEM FOR ELECTRONIC EQUIPMENT

BACKGROUND OF THE INVENTION

The present invention is directed to a modular housing system for electronic packages, in particular, in the field of data technology, which are composed of capping pieces of, in particular, extruded sections provided with guide grooves in a longitudinal direction that are modularly joined with corner nodes and connect or elements adaptable for the respective application.

The structuring of electronic equipment, in particular in the field of data technology, that can be quickly varied and that is simple to construct requires a universal housing concept which permits customized housing. Previously, specific housings corresponding to the required demands were frequently created for smaller systems and apparatus. Identical basic designs are at most used for the framing and in a variety of facade or cover parts, these basic designs not allowing for any variation in height. A disadvantage of these systems is particularly seen in the constantly recurring development requirements for new products. A further disadvantage is the limited use of the same parts and tools for different products. The difficulty in providing common housing parts and the non-uniform appearance as viewed over several products are additional drawbacks in the prior art.

For these reasons a more flexible housing format has been sought. Thus, for example, there is a system, the ITEM MB-system, for resolving a variety of technical problems, examples thereof being described in the brochure of the ITEM Company, Industrietechnik und Maschinenbau. In this system, extruded sections having different cross sections are screwed to one another and tenon blocks with which it is possible to fasten a great variety of elements are introducible into guide channels. This system, however, is mainly suited as a shelving system for workshops in order to provide variable storing space for a wide variety of warehouse products. Smaller dimensions of the section would be necessary for weight reasons when used as a cabinet system such as, for example, in the field of data technology. Considerable problems, however, would result due to the nature of the section design, since in order, for example, to attach screwed connections and the like, the necessary strength would not longer be present for a proportional reduction of the section selected. Moreover, additional holes must be bored in corner connectors dependent on the utilization, these making assembly more difficult and increasing the time expended.

German Patent 32 26 192 discloses corner connectors for connecting capping pieces at the corners for constructing racks of hollow tubes. The corner connectors which are fashioned in three directions perpendicularly relative to one another, are plugged into the hollow tubes and are glued thereto. Such a design, however, has the disadvantages associated with gluing techniques, for example a long set-up time, long curing time and, as a result, a great need for fabrication area and apparatus.

SUMMARY OF THE INVENTION

It is an object of the present invention to provide a housing system for electronic equipment, in particular, in the field of data technology that can be quickly varied and that can be easily constructed.

In order to achieve this object, the modular housing system of the present invention is fashioned such that guide grooves have a keyhole-shaped cross section and proceed on the respective lateral surfaces of capping pieces at the edges and/or parallel to the edges and in the proximity thereof. Bores are provided in the end faces of the capping pieces at the edges at which no guide grooves exist and a further bore is provided in the center of the cross section of the end faces. The capping pieces are connectable to one another via corner nodes. The corner nodes are provided with respectively two pegs positioned diagonally opposite one another at three sides allocated to different coordinate planes, these pegs engaging the end-face bores or guide grooves of the capping pieces. A first bore having a smaller diameter that is countersunk in the inside of the corner node is provided between the two pegs and a larger bore is provided in the opposite surface without pegs. Capping pieces and corner nodes, after being plugged into one another, are joined with a screw, particularly a self-tapping screw, introduced through the bore in the center of the capping piece cross section. Retainer and/or spring elements are removably located in the guide grooves of the capping pieces.

The result is a module housing system that can be quickly constructed, adapted to the specific utilization and expanded in a simple manner. In order to also provide adequate stability for a heavier weight of addon units, the modular housing system can also be fashioned such that the extruded section in at least one coordinate direction has an n-fold dimension of the original section and the guide channels and bores in the additional parts are preferably arranged with the same configuration as in the original cross section.

Further, the corner nodes in at least one coordinate direction can have a multiple dimension in comparison to a cubically fashioned corner node and just as many bores can be provided per added coordinate plane.

Further, the corner nodes in at least one coordinate direction can have a multiple dimension in comparison to a cubically fashioned corner node and just as many bores can be provided per added coordinate plane.

Tenon blocks having set screws are provided as retainer elements. However, profiles engagable into the guide grooves can also be used as retainer elements.

Spring elements that are approximately fashioned Wshaped are provided for radio-frequency shielding, whereby the upper part of the middle leg of the spring element has a cross section approximately forming a downwardly open trapezoid that serves as a guide element in the guide grooves of the capping pieces. The spring element can also be composed of two parallel pegs each of which forms the base of an equilateral triangle and which are connected to one another via an approximately trapezoidal guide part, whereby the trapezoidal guide part can be inserted in the guide grooves of the capping pieces. Another embodiment provides that the spring element is fashioned approximately V-shaped, whereby the pointed part of the spring element approximately forms a trapezoid and the upper part of the two pegs of the spring element are bent in an outward direction and one part is bent in inward direction parallel to the angled part.

For sealing the cabinet against dust and noise emission, and for joining a plurality of housing modules side-by-side or on top of one another, sealing profiles or spacers can be provided between the individual modules. These sealing profiles or spacers are engagable between the two spring pegs and have an arrow-shaped cross section at one end and a trapezoidally fashioned ledge at the other end perpendicular to the shaft of the arrow cross section.

For greater stabilization of the modular housings horizontally extending rails can be secured to the vertically extending capping pieces or, alternately, perpendicularly extending U-shaped rails can be secured to the horizontally extending capping pieces.

Advantageously, equipment such as, for example, assemblies can be secured to the U-shaped rails.

For protecting the modular housing system against vibrations, framing feet are provided that are screwed against the frame from below via cross heads and that are provided with at least one hydrobearing and are fashioned height-adjustable. Instead of a hydrobearing, a sheet metal piece, which is fashioned U-shaped for a vibration damping effect and which simultaneously serves as carrier for the framing, can be provided for lower stress applications.

In order to expand the framing system into a complete cabinet, it is advantageous to provide cover plates held by the tenon blocks and to secure door hinges for cabinet doors on the tenon blocks at a desired side.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. in which like reference numerals identify like elements, and in which:

FIG. 2 is an exploded perspective view of a portion of a framing design having cover parts;

FIG. 3 is a perspective view of retainer elements that are fashioned as sections engagable in channels;

FIG. 4 is a perspective view of an apparatus design reinforced with transverse and longitudinal rails;

FIG. 5 is a perspective view of a vibrationdamping foot provided with a hydrobearing;

FIG. 6 is a perspective view of a vibrationdamping foot provided with a U-shaped beam; and FIG. 7 is a perspective view depicting the connectability of a plurality of housings.

DESCRIPTION OF THE PREFERRED EMBODIMENT

Figure 1:
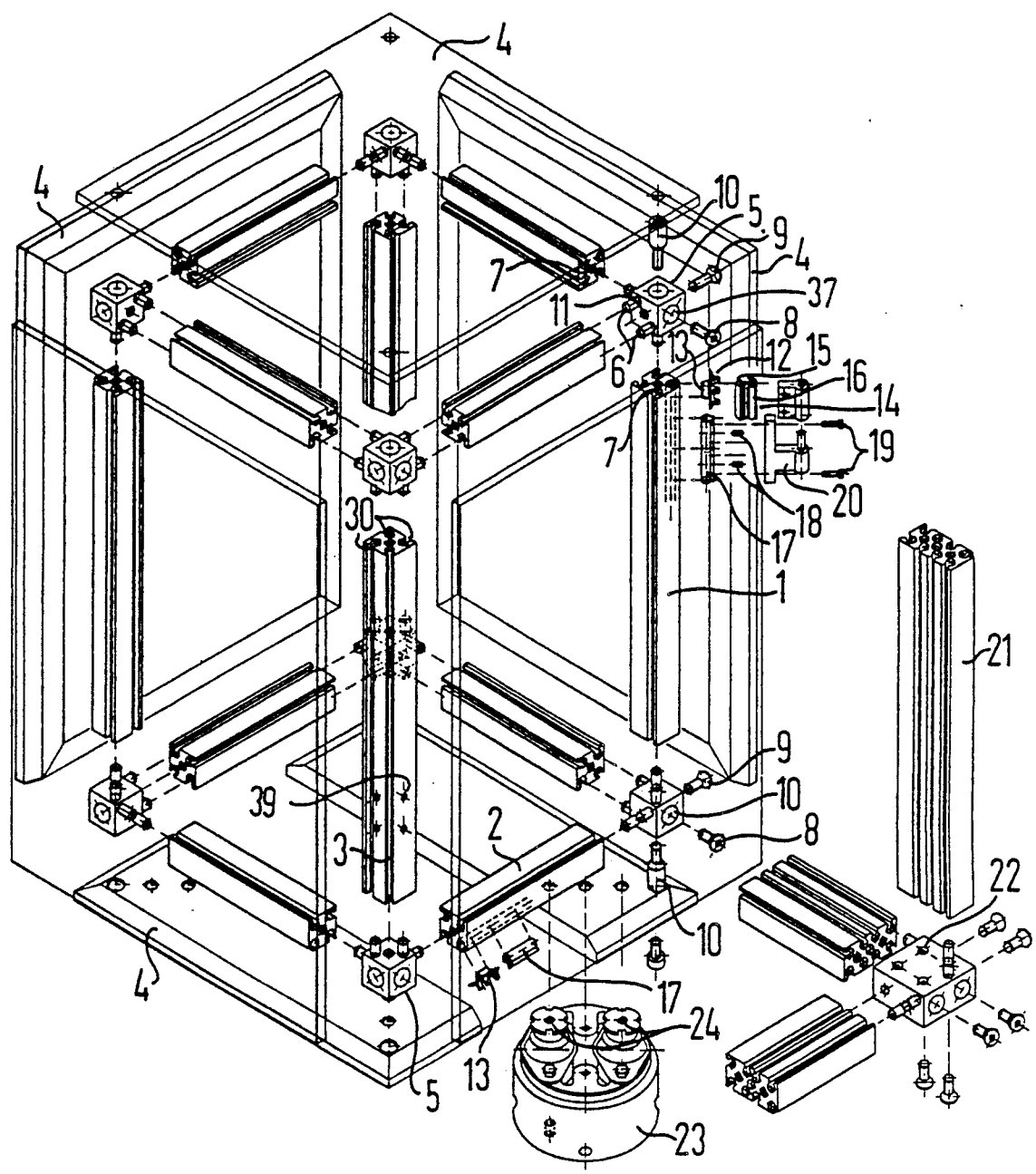
FIG. 1 is an exploded perspective view of a framing design according to the present invention.

The present invention has general applicability, but is most advantageously utilized in providing a housing for electronic equipment in the field of data technology.

FIG. 1 shows the basic structure of a data cabinet using the modular housing system. The longitudinal capping pieces 1 and the transverse capping pieces 2 are composed of an extruded section wherein the guide grooves 3, 30 have a keyhole-shaped cross section. Three of the guide grooves 30 are positioned parallel and in the proximity of the edges of the capping pieces 1, 2, whereas one guide groove 3 runs along the edge of the extruded section. The guide groove 3, however, could also proceed in the proximity of the edge like the other three guide grooves 30, whereby the deciding factor in determining which of the embodiments is preferred depends on whether cover plates 4 abut one another at an angle of 45°, as shown in FIG. 1, or at an angle of 90°, as shown in FIG. 2.

The individual capping pieces 1, 2 are connected to one another via corner nodes 5. To this end, respectively two pegs 6 residing diagonally opposite one another are provided in the corner nodes at three sides residing perpendicularly relative to one another. These pegs 6 acting as guide elements engage the guide grooves 3, 30 or bores of the capping pieces 1, 2. A bore 7 into which the screws 8, 9 and 10 are screwed, preferably in self-tapping fashion, is located in the center of the capping pieces. The corner node is thereby fashioned such that a bore 37 that is of such a size that the screw head of the screws 8, 9, 10 can be plugged therethrough is provided at those sides at which no pegs are situated. A smaller bore 11 that is of such size that the screw shank of the respective screws 8, 9 or 10 can be plugged therethrough is located in the opposite side, i.e. respectively between the two pegs 6. In addition, this bore 11 is provided with a countersink in the inside of the cube into which the pan head screws 8, or 9 are countersunk such that they have their screw head surface flush with the respectively inside side of the cube, so that the screw 10 can likewise be introduced into the corner nodes and into the capping piece appertaining thereto. When all four sides of the capping pieces are not provided with guide grooves, then corresponding blind holes or through bores for introduction of the pegs 6 must be provided at the remaining sides.

Spring elements 12 can be introduced into the guide grooves 3, 30 for radio-frequency shielding and for sealing against dust. The cross sections of these springs are fashioned approximately W-shaped, whereby the upper part of the middle leg of the spring elements has a cross section approximately shaped as a downwardly open trapezoid 13 that serves as a guide element in the guide grooves 3, 30 of the capping pieces 1, 2. Dependent on the utilization, the two outer legs of the spring element 12 can then be bent outwardly or inwardly. Sealing profiles 14 can be engaged between the two spring jaws of the spring elements 12, these sealing profiles 14 having an arrow-shaped cross section at one end 15 with which they engage the trapezoidal cross section 13 of the spring elements 12 and spread out there. An approximately trapezoidally fashioned ledge 16 is then located at the opposite side of the end 15. This sealing profile 14 can also be mounted as a spacer when a plurality of housing modules are to be arranged side-by-side or on top of one another. The radio-frequency connection and the housing sealing between the facades of the modules can thus also be produced in a simple manner.

Tenon blocks 17 are used as retainer elements and these, for example, can be clamped in the grooves with two screws 18 and also have additional screw holes into which, for example, screws 19 can be turned that, as shown in the present embodiment, hold a door hinge 20 at the tenon block 17. Capping pieces 21 as well as a corner node 22 having a doubled cross section (herein referred to as an n-fold dimension) for greater loads are shown at the right next to the housing in FIG. 1.

Feet 23 are attached at the four corners of the housing, only one foot being shown for the sake of clarity in FIG. 1. As depicted the foot 23 is provided with two hydrobearings 24 on which a crosshead that carries the housing can then be attached.

FIG. 2 shows in a partial view a housing wherein the two side coverings 4 abut one another at an angle of 90°; the capping pieces 1 are thereby fashioned such that their guide grooves 30 respectively proceed parallel to the edges at the verges of the respective lateral surfaces of the capping pieces 1, 2. Otherwise, the design is the same as already set forth with reference to FIG. 1.

FIG. 3 shows an embodiment wherein profiles 25, 26 are inserted as retainer elements into the guide grooves 30 of the capping pieces 1, 2 instead of the tenon blocks. These profiles, for example, can be secured with a screw 27.

FIG. 4 shows how the stability of the framings can be increased. The U-shaped rails 28, 29 are provided, for example, parallel to the transverse and longitudinal capping pieces 2. These U-shaped rails can be simultaneously utilized as fastening means for electronic assemblies 31, such as, flat modules. The fastening angles 38 of the U-shaped rails 29 simultaneously increase the stabilizing effect of the corner nodes. The U-shaped rail 28 is attached by means of assorted bores 39 in the cap piece (see FIG. 1).

FIG. 5 shows a vibration-damping foot 32 that is provided with only one hydrobearing 24. The inside of the this foot is equipped with a threaded disc that can move in a thread within the foot dish, whereby the hydrobearing 24 is screwed onto the threaded disc. This provides for height adjustment in the assembled vibration-damping foot 32 by turning the disc-shaped foot dish, for example with a screw driver through the bores 33. The adjustment of the foot is thereby further facilitated in that the foot dish is crowned in an outward direction at its supporting side. Simultaneously, this also prevents the foot from standing at a slant for different loading of the respective housing sides.

FIG. 6 shows a simpler foot for less demands with respect to the vibration damping. It is fashioned structurally the same as the foot depicted in FIG. 5 instead of a hydrobearing, however, it has a simple U-shaped sheet 34 as a vibration-damping element.

FIG. 7 shows how a plurality of housings can be joined to one another to forma a uniform front. A spacer 36 is placed between two respective housings. The small, remaining gap between the door 35 and the spacer 36 is respectively closed with a sealing profile 14. A plurality of housings can also be stacked on top of one another in an equivalent fashion. Like the individual housing, the interior of the housing stacked or placed in rows in this fashion is radio-frequency shielded.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A modular housing system for electronic equipment composed of capping pieces provided with guide grooves in a longitudinal direction that can be modularly joined with corner nodes and connector elements adaptable for a respective utilization, comprising: guide grooves having a keyhole-shaped cross section and extending along the edges of respective lateral surfaces of the capping pieces; end-face bores in end faces of the capping pieces for edges along which no guide grooves extend and a further bore in a center of the cross section of the end faces; the capping pieces being joined to one another via corner nodes; the corner nodes having two pegs positioned diagonally opposite one another on each of three sides allocated to different coordinate planes, each of said pegs engaging respectively one of the end-face bores or guide grooves of the capping pieces; in each of the three sides, a first bore having a small diameter, which is countersunk into the inside of the corner node, located between the respective two pegs, and a larger bore provided in the opposite surface without pegs; and the capping pieces and corner nodes, after being plugged into one another, joined by screws introduced through the larger bore and the first bore of the corner node and into the further bore in the center of the cross section of the capping piece.

2. The modular housing system for electronic packages according to claim 1, wherein the capping pieces have an n-fold dimension of the original capping pieces in at least one coordinate direction and the guide grooves and end-face bores, further bores and larger bores are located in additional portions of the capping pieces with a substantially equivalent configuration as the configuration of 1-fold dimension parts.

3. The modular housing system for electronic packages according to claim 1, wherein the corner nodes have an n-fold dimension in at lest one coordinate direction compared to a cubically fashioned corner node and just as many bores are provided per added coordinate direction.

4. The modular housing system for electronic packages according to claim 1, wherein the system further comprises at least one retainer element removably located in at lest one of the guide grooves of the capping pieces.

5. The modular housing system for electronic packages according to claim 4, wherein the retainer element is a tenon block having at least one set screw.

6. The modular housing system for electronic packages according to claim 4, wherein the retainer element has means for engaging the guide grooves.

7. The modular hosing system for electronic packages according to claim 1, wherein the system further comprises at least one spring element removably located in at least one of the guide grooves of the capping pieces.

8. The modular housing system for electronic packages according to claim 7, wherein the spring element is fashioned approximately W-shaped, whereby a middle of the spring element has a cross section in an upper part approximately forming a downwardly open trapezoid that serves as a guide element in the guide grooves of the capping pieces.

9. The modular housing system for electronic packages according to claim 7, wherein the spring element is composed of two parallel legs each of which forms the base of an equilateral triangle and which are joined to one another via an approximately trapezoidal guide part, whereby the trapezoidal guide part is guided in the guide grooves of the capping pieces.

10. The modular housing system for electronic packages according to claim 7, wherein the spring element is fashioned approximately V-shaped, whereby a pointed part of the spring element approximately forms a trapezoid and an upper part of the two legs of the spring element is angled in an outward direction, one part being bent in an inward direction parallel to the angled upper part.

11. The modular housing system for electronic packages according to claim 1, wherein horizontally extending Ushaped rails are secured to capping pieces which extend vertically.

12. The modular housing system for electronic packages according to claim 1, wherein vertically extending U-shaped rails are secured via corner rails to the capping pieces which extend horizontally.

13. The modular housing system for electronic packages according to claim 10, wherein equipment are secured to the U-shaped rails.

14. The modular housing system for electronic packages according to claim 1, wherein framing feet are screwed from below to a framing formed by the modular housing system via cross heads and are provided with at least one hydrobearing element and are height-adjustable.

15. The modular housing system for electronic packages according to claim 1, wherein a plate having a U-shaped configuration and having a vibration-damping effect is attached from below to a framing formed by the modular housing system.

16. The modular housing system for electronic packages according to claim 1, wherein a framing formed by the modular housing system is provided with coverings held by tenon blocks, the tenon blocks being attached to the framing.

17. The modular housing system for electronic packages according to claim 1, wherein door hinges are secured to the tenon blocks, the tenon blocks being attached to the framing.

18. The modular housing system for electronic packages according to claim 11, wherein assorted bores extending perpendicularly to the guide grooves and respectively between two guide grooves are provided for attachment of the horizontally extending U-shaped rails.

19. The modular housing system for electronic packages according to claim 9, wherein equipment are secured to the U-shaped rails.

20. The modular housing system for electronic packages according to claim 1, wherein the capping piece is an extruded section.

21. The modular housing system for electronic packages according to claim 1, wherein at least one of the guide grooves extends along the edge of the respective lateral surface of the capping piece and parallel to the edge.

22. The modular housing system for electronic packages according to claim 1, wherein at least one of the guide grooves extends along the edge of the respective lateral surface of the capping piece on a verge of the edge.

23. The modular housing system for electronic packages according to claim 1, wherein the screws are self-tapping screws.

* * * * *